US007463036B2

(12) United States Patent
Finney et al.

(10) Patent No.: US 7,463,036 B2
(45) Date of Patent: Dec. 9, 2008

(54) MEASUREMENT OF ANALOG COIL VOLTAGE AND COIL CURRENT

(75) Inventors: Dale Finney, Oshawa (CA); Adil Jaffer, Markham (CA); Zhihong Mao, Stouffville (CA); William Premerlani, Scotia, NY (US); Mark Adamiak, Paoli, PA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/617,048

(22) Filed: Dec. 28, 2006

(65) Prior Publication Data

US 2008/0156791 A1 Jul. 3, 2008

(51) Int. Cl.
*G01R 31/02* (2006.01)

(52) U.S. Cl. ......................... 324/424; 361/115; 702/65; 700/49

(58) Field of Classification Search ................. 324/464, 324/424; 361/115; 702/182; 340/635
See application file for complete search history.

(56) References Cited

U.S. PATENT DOCUMENTS

| | | | | |
|---|---|---|---|---|
| 5,636,134 | A * | 6/1997 | Johnson et al. | 702/34 |
| 5,754,386 | A | 5/1998 | Barbour et al. | |
| 5,801,461 | A * | 9/1998 | Anger et al. | 307/139 |
| 6,233,132 | B1 * | 5/2001 | Jenski | 361/160 |
| 6,430,518 | B1 * | 8/2002 | Roche | 702/65 |
| 6,611,724 | B1 * | 8/2003 | Buda et al. | 700/49 |
| 6,801,376 | B2 * | 10/2004 | Smith | 360/31 |
| 7,265,960 | B2 * | 9/2007 | Zipagan | 361/115 |
| 2005/0270717 | A1 * | 12/2005 | Zipagan | 361/115 |

FOREIGN PATENT DOCUMENTS

| | | | |
|---|---|---|---|
| FR | 2884660 | A1 | 10/2006 |
| GB | 2275541 | A | 8/1994 |
| WO | WO 9323760 | A1 * | 11/1993 |

* cited by examiner

*Primary Examiner*—Vincent Q. Nguyen
*Assistant Examiner*—Benjamin M Baldridge
(74) *Attorney, Agent, or Firm*—Global Patent Operation; Roger C. Philips

(57) ABSTRACT

The measurement of analog coil voltage and coil current during the energizing of the circuit breaker coil that is connected to the output contact of a protective circuit breaker relay in order to detect an incipient failure of the circuit breaker mechanism.

8 Claims, 1 Drawing Sheet

MEASUREMENT OF ANALOG COIL VOLTAGE AND COIL CURRENT

RELATED APPLICATIONS

Figure 1:
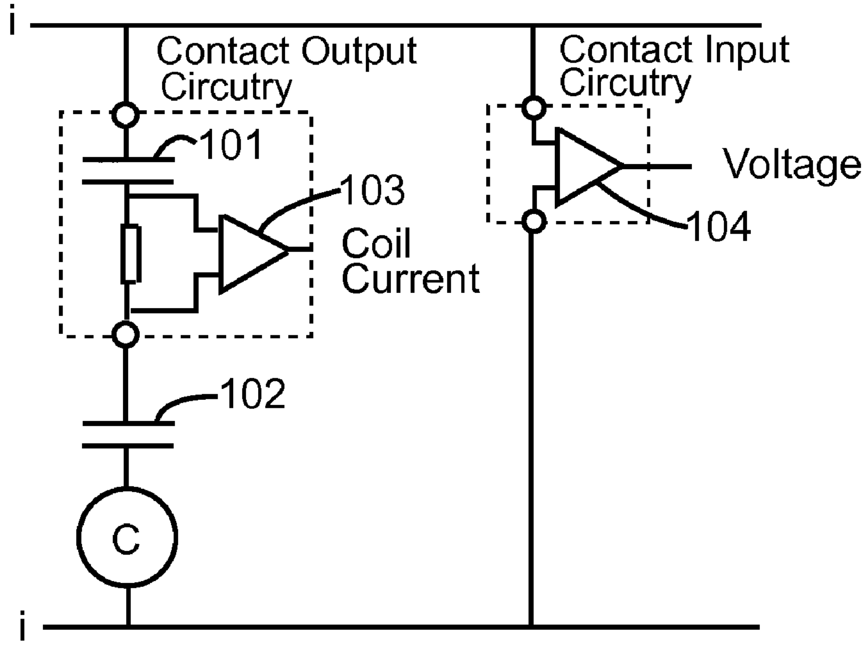

The disclosure and invention described herein is a portion of a total system in which other portions are described in other applications being filed concurrently herewith. In addition to the present, other related disclosures of the total system are described in applications entitled Apparatus, Methods, And System For Role-Based Access In An Intelligent Electronics Device; and Intelligent Electronic Device With Integrated Pushbutton For Use In Power Substation; the disclosures of which are incorporated in toto herein.

BACKGROUND OF THE INVENTION

Circuit breakers are widely used to protect electrical lines and equipment. The circuit breaker monitors current through an electrical conductor and trips to interrupt the current if certain criteria are met. One such criterion is the maximum continuous current permitted in the protected circuit. The maximum continuous current the circuit breaker is designed to carry is known as the frame rating. However, the breaker can be used to protect circuits in which the maximum continuous current is less than the circuit breaker frame rating, in which case the circuit breaker is configured to trip if the current exceeds the maximum continuous current established for the particular circuit in which it is used. This is known as the circuit breaker current rating. Obviously, the circuit breaker current rating can be less than but cannot exceed the frame rating.

Within conventional circuit breakers, the contact output of a protection relay within the breaker is connected to the coil of the breaker which in turn is used to trip the power line halting the flow of current through the circuit breaker to the load. The circuit breaker, which is often subject to harsh operating conditions such as vibrations, shocks, high voltages, and inductive load arcing is thus a critical device to the operation providing current flow to the ultimate load. Due to the harsh operating conditions that circuit breakers are subject to, above average failure rates are difficult to maintain, and manpower must be expended continuously to ensure the availability of the power system and power to the ultimate load. A signature analysis of the waveform of the current passing through the DC trip coil of a circuit breaker may be used to detect changes in the structure of the trip mechanism of the breaker. Normally the waveform of the trip coil current is highly repeatable, and a change in the waveform is often the initial sign that the mechanical characteristics of the trip mechanism or the electrical characteristics of the trip coil have changed.

Although there are dedicated devices designed to measure the circuit breaker coil voltage and current, there are no protective relays that measure the circuit breaker coil voltage and current and carry out a signature analysis in order to detect changes that indicate an evolving failure. Any prior work in the area of circuit protection of which we are aware has involved the use of digital detection of currents and voltages present in the contact output and, in this instance, the digital measurements were used to provide feedback on the correct operation of the contact input and had no impact on the diagnosis of breaker coil health.

On-line circuit breaker condition monitoring offers many potential benefits such as, for example, improved service reliability, higher equipment availability, longer equipment life, and ultimately, reduced maintenance cost. On-line monitoring represents an opportunity to improve the information system used to support maintenance. Parameters can be continuously monitored and analyzed with modern electronics to supplement the activities of maintenance personnel.

Figure 2:
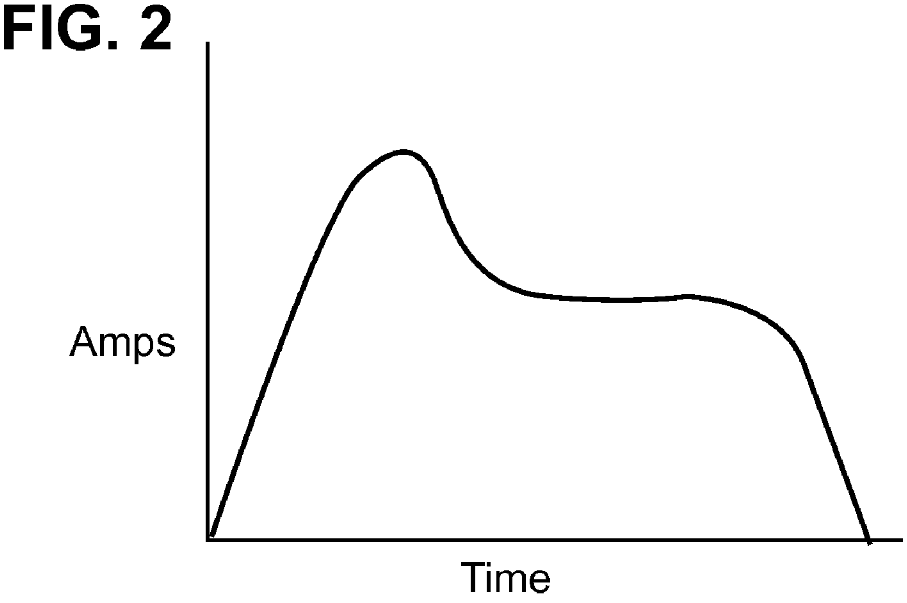

Those skilled in the art will have a thorough and complete understanding of the invention from reference to the following figures and detailed description:

FIG. 1 depicts the coil signature wiring schematic according to the present invention; and FIG. 2 depicts a typical trip coil waveform according to the present invention.

In the following description of the improvements made to measure analog coil voltage and coil current to anticipate failure of a power system, it is noted that the contact output of a protection relay is used to trip a circuit breaker coil. This coil is an electro-mechanical solenoid that releases a stored-energy mechanism that acts to open or close the circuit breaker. During the energizing of the coil, the voltage across the coil, the current flowing through the coil, and the corresponding energy being dissipated will have a particular time characteristic. By analyzing the changes in these characteristics we have found it is possible to detect various incipient failure modes of the circuit breaker, and to signal to the user that preventative maintenance is required.

Through the use of transformer isolated DC-DC converters and analog optical isolation of the total system, these improvements are the first to incorporate this functionality directly within the contact output, by implementing isolated analog measurement of voltage and current through the contact output energizing the breaker coil.

The general shape of the waveform is that of a simple exponential with a time constant equal to the ratio of the inductance of the coil to the resistance of the coil. The initial slope of the waveform depends upon the ratio of the applied voltage to the initial inductance of the coil. The final value of the current depends upon the ratio of the applied voltage to the resistance of the coil. Because the trip coil contains a moving armature, the inductance of the coil changes with time and the waveform of the trip coil current is not exactly an exponential. The amount and timing of the deviation from a simple exponential is strongly dependent upon the details of the motion of the armature.

As indicated previously, a signature analysis of the waveform of the energy dissipated in the operating coil of a circuit breaker (i.e., the current through the DC trip coil) can be used to detect changes in the structure of the trip mechanism of the breaker. Normally the waveform of the trip coil current energy is highly repeatable, and a change in the waveform is often the initial sign that the mechanical characteristics of the trip mechanism or the electrical characteristics of the trip coil have changed. Thus, the coil signature element generates an alarm if the signature analysis results in a significant deviation for a particular coil operation. It is also possible to perform signature analysis of AC trip coil currents, but the analysis is complicated by the randomness in the timing of the energization of the coil relative to the phase angle of the applied voltage. Fortunately, most of the circuit breakers for utility applications use DC trip coils because batteries are used to supply control power to a substation.

As anticipated in the present invention, the coil signature element will also include a baseline feature. The coil signature element measures the maximum coil current, the duration of the coil current, and the minimum voltage during each coil operation. Averaged values of these measurements are calculated over multiple operations, allowing the user to create baseline values from the averaged values. The coil signature element will use these baseline values to determine if there has been a significant deviation in any value during a particular breaker coil operation.

With respect to FIG. 1, there is shown a shown a coil signature wiring schematic, wherein the coil current is measured by a DC current monitor that has, preferably, been integrated into the contact output circuitry. A tropical trip coil current waveform resulting from such a coil signature element schematic is shown in FIG. 2. As depicted, the coil signature element is able to produce the following measurements: coil energy (i.e., the product of coil voltage and coil current integrated over the duration of coil operation); current maximum (i.e., the maximum value of the coil current for a coil operation); current duration (i.e., the time which the coil current exceeds a precalibrated current level, preferably 0.25 amperes, during a coil operation); voltage minimum (i.e., the lowest value of the voltage during a coil operation); coil signature (i.e., the value of coil energy averaged over multiple operations); average current maximum (i.e., the maximum coil current averaged over multiple operations); average current duration (i.e., the coil current duration averaged over multiple operations); and average voltage minimum (i.e., the voltage minimum averaged over multiple operations).

More specifically, FIG. 1 depicts a coil circuit wiring schematic comprised of both a contact output circuitry and a contact input circuitry. Coil current is measured in the contact output circuitry by DC current monitor (103), and voltage is measured in the contact input circuitry by DV voltage monitor (104). Current reaching current monitor (103) first passes through relay contacts (101 and 102). It is preferred that the electrical output from the monitoring devices (103 and 104) are received by a microprocessor (not shown) after first passing through a linear opticoupler (not shown) as a means of electrically isolating the coil signature elements from the circuit beaker per se. The microprocessor is programmed to compute the values for the mathematical equations shown below.

The measurement of the coil current utilizing the coil signature device depicted in FIG. 1 is provided by the monitoring circuitry of the contact output that is used to energize the coil. Prior to energizing the coil, it is expected that there will be a voltage across the contact. When the coil is energized, this voltage will drop to zero. Therefore, this function will be triggered by a negative transition voltage operand associated with this contact output. Once triggered, the element will remain active for the period determined by the trigger duration setting.

With respect to FIG. 2, a typical trip coil current waveform is depicted wherein the general shape of the waveform, as stated above, is that of a simple exponential with a time constant equal to the ratio of the inductance of the coil to the resistance of the coil.

The signature analysis is performed for each operation of the circuit breaker by comparing the trip coil current waveform with the average waveform computed from all of the previous operations (i.e., a baseline value).

It is first necessary to establish the average waveform over many operations of the breaker, that is each time the breaker is operated, to capture and scale the current waveform:

$$V(\tau)=v(t_{start}+\tau)$$

$$I(\tau)=i(t_{start}+\tau)/i(t_{end})$$

$$P(\tau)=V(\tau)\times I(\tau)$$

In the above mathematic equation, "V" refers to voltage, "I" refers to amperes, "P" refers to power, and "τ" ranges from zero to the difference between the ending and starting time; the starting time being the moment when the current through the coil starts flowing. This is actually the starting time being the moment when the current through the coil becomes greater than 0.25 amps; and the ending time being the moment when the current becomes less than 0.25 amps. The difference between the ending time and the starting time is selected ahead of time by the user to capture the complete waveform. This scaling process somewhat compensates for variations in control voltage. Both the initial time rate of change of the current as well as its final value are proportional to the control voltage.

Next, the current signature is computed by simply adding all of the waveforms and dividing by the number of waveforms to obtain the mathematical mean:

$$\bar{I}(\tau)=\frac{1}{N}\sum_{k=1}^{N}I_k(\tau)$$

Similarly, the energy signature is calculated by adding all of the waveforms and dividing by the number of waveforms. In short, by substituting "P" for "I" in the above equation.

It is also necessary to estimate the square of the variability of the waveforms:

$$S^2(\tau)=\frac{1}{N-1}\sum_{k=1}^{N}(I_k(\tau)-\bar{I}(\tau))^2$$

$$S^2(\tau)=\frac{1}{N-1}\sum_{k=1}^{N}(P_k(\tau)-\bar{P}(\tau))^2$$

Finally, it is useful to estimate the net uncertainty squared, integrated over the time span of the waveforms:

$$U^2=\frac{1}{t_{end}-t_{start}}\int_0^{t_{end}-t_{start}}S^2(\tau)d\tau$$

The reader should note that while in the preceding equations, the waveforms are treated as continuous functions, this is for explanatory purposes in better understanding the invention. It should be understood by those skilled in the art that in practice the waveforms are actually sampled and that the previous integral is computed numerically by taking the sum over the samples.

The procedure according to the present invention for detecting changes in the trip coil current waveform, is to actually to compute the deviation of the waveform from the signature, each time the breaker trips. That is, compute the deviation squared, integrated over the time span of the waveform:

$$D^2=\frac{1}{t_{end}-t_{start}}\int_0^{t_{end}-t_{start}}(P(\tau)-\bar{P}(\tau))^2d\tau$$

In this equation the designation "D" is a calculation of how far the trip coil energy deviates from the signature. Whether or not the deviation is significant is determined by comparing D with a multiple of U, or by comparing D square with a multiple of U square. The multiple depends, obviously, on the desired confidence interval, and can be set using well known statistical properties of the normal distribution. For example, for a 99.7% confidence interval, a so-called 3-sigma interval, the multiplier is three, i.e., the deviation is deemed significant if D squared (or $D^2$) is greater than 9 times U squared.

If the deviation is not significant, the new waveform is used to update the average and U squared. If it is significant, it is not used for an update and a significant deviation is declared meaning that the user may anticipate a evolving failure and that maintenance of the circuit breaker should be attended to or scheduled in the near future.

Thus, a coil signature alarm will be declared if:

$$D^2 > M^2 \cdot U^2$$

Wherein "M" is a value depending upon a predetermined confidence interval setting. More specifically, "M" is taken from the following table for the specific confidence interval setting by the user:

| Confidence Interval Setting | M |
|---|---|
| 0.990 | 2.5758 |
| 0.991 | 2.6121 |
| 0.992 | 2.6521 |
| 0.993 | 2.6968 |
| 0.994 | 2.7478 |
| 0.995 | 2.8070 |
| 0.996 | 2.8782 |
| 0.997 | 2.9677 |
| 0.998 | 3.0902 |
| 0.999 | 3.2905 |

In addition to the above, the coil signature element is able to produce the following measurements:

current maximum (i.e., the maximum value of the coil current for a coil operation):

$$I_{max} = \max(I(\tau))$$

voltage minimum (i.e., the lowest value of the voltage during a coil operation);

$$V_{min} = \min(V(\tau))$$

current duration (i.e., the time which the coil current exceeds a precalibrated current level, preferably 0.25 amperes, during a coil operation);

$$\Delta t = t_{end} - t_{start}$$

The averaged values of these signals my then be calculated:

average current maximum (i.e., the maximum coil current averaged over multiple operations);

$$\bar{I}_{max} 1/N \Sigma^{N}_{k=1} \bar{I}_{max}$$

average voltage minimum (i.e., the voltage minimum averaged over multiple operations):

$$av.V_{min} = 1/N \Sigma^{N}_{k=1} V_{min}$$

average current duration (i.e., the coil current duration averaged over multiple operations):

$$av.\Delta t = 1/N \Sigma^{N}_{k=1} \Delta t$$

Once calculated, and if the established baseline is asserted, then:

$$I_{BASELINE} = I_{MAX}$$

$$\Delta t_{BASELINE} = av.\Delta t$$

A high current alarm will be preprogrammed at the time of manufacture to be declared indicating a potential failure of the circuit breaker, and to signal to the user that preventative maintenance is required if:

$$I_{MAX} > 1.05 \cdot I_{BASELINE}$$

Similarly, a long current duration alarm will be declared if:

$$\Delta t > 1.05 \cdot \Delta t_{BASELINE}$$

Similarly, a low voltage alarm will be declared if:

$$V_{MIN} < 0.95 \cdot V_{BASELINE}$$

Such alarms may, of course, may be provided the user as visual, electronic, or audible signals indicating that the preprogrammed limits have been reached and exceeded.

While we have illustrated and described a preferred embodiment of this invention, it is to be understood that this invention is capable of variation and modification, and we therefore do not wish to be limited to the precise terms set forth, but desire to avail ourselves of such changes and alternations which may be made for adapting the invention to various usages and conditions. Accordingly, such changes and alterations are properly intended to be within the full range of equivalents, and therefore within the purview, of the following claims.

The invention claimed is:

1. A method to determine a deviation in a time characteristic of a circuit breaker coil within a power system which comprises a coil signature element, the method comprising:

measuring an analog coil voltage and a coil current of the circuit breaker coil to determine a time characteristic baseline solely for the voltage across the circuit breaker coil and solely for the current flowing through the circuit breaker coil;

measuring an analog coil voltage and a coil current of the circuit breaker coil over time to determine an ongoing time characteristic solely for the voltage across the circuit breaker coil and solely for the current flowing through the circuit breaker coil and wherein each measuring of the analog coil voltage and the coil current comprises measuring the maximum circuit breaker coil current, the duration of the current flowing through the circuit breaker coil, and the minimum voltage during each coil operation;

comparing the ongoing time characteristic with the time characteristic baseline to identify any changes from the time characteristic baseline that exceed a predetermined threshold; and outputting a signal where the changes exceed the predetermined threshold.

2. A method to determine a deviation in a time characteristic of a circuit breaker coil within a power system which comprises a coil signature element, the method comprising:

measuring an analog coil voltage and a coil current of the circuit breaker coil to determine a time characteristic baseline solely for the voltage across the circuit breaker coil and solely for the current flowing through the circuit breaker coil;

measuring an analog coil voltage and a coil current of the circuit breaker coil over time to determine an ongoing time characteristic solely for the voltage across the circuit breaker coil and solely for the current flowing through the circuit breaker coil;

comparing the ongoing time characteristic with the time characteristic baseline to identify any changes from the time characteristic baseline that exceed a predetermined threshold; and outputting a signal where the changes exceed the predetermined threshold;

wherein measuring the analog coil voltage and the coil current of the circuit breaker coil to determine a time characteristic baseline comprises developing waveforms for said circuit breaker by repeatedly measuring voltage, current and power measurements utilizing the mathematical equations:

$$V(t)=V(t_{start}+t)$$

$$I(t)=i(t_{start}+t)/i(t_{end})$$

$$P(t)=V(t)\times I(t)$$

wherein "V" refers to voltage, "I" refers to amperes, "P" refers to power, and "t" ranges from zero to the difference between the ending and the starting time; the ending and the starting time being at predetermined amplitudes of current flowing through the circuit breaker coil.

3. A method according to claim 2 wherein said predetermined amplitude for starting time is when the current through the circuit breaker coil becomes greater than 0.25 amps; and the predetermined amplitude for the ending time is when the current becomes less than 0.25 amps.

4. A method according to claim 3 further comprising computing a current signature ($\bar{I}(\tau)$) and an energy signature ($\bar{P}(\tau)$) by adding said waveforms and dividing by the number of waveforms to obtain the mathematical mean, i.e., by the equations:

$$\bar{I}(\tau)=\frac{1}{N}\sum_{k=1}^{N} I_k(\tau);\text{ and }\bar{P}(\tau)=\frac{1}{N}\sum_{k=1}^{N} P_k(\tau).$$

5. A method according to claim 4 further comprising obtaining the square of the variability of the waveforms by the equations:

$$S^2(\tau)=\frac{1}{N-1}\sum_{k=1}^{N}(I(\tau)-\bar{I}(\tau))^2$$

$$S^2(\tau)=\frac{1}{N-1}\sum_{k=1}^{N}(P(\tau)-\bar{P}(\tau))^2.$$

6. A method according to claim 5 further comprising obtaining the net uncertainty squared, integrated over the time span of the waveforms by the equation:

$$U^2=\frac{1}{t_{end}-t_{start}}\int_0^{t_{end}-t_{start}} S^2(\tau)\,d\tau.$$

7. A method according to claim 4 further comprising computing a deviation of the waveform from the energy signature ($\bar{P}(\tau)$), each time the breaker trips, i.e., computing the deviation squared, integrated over the time span of the waveform:

$$D^2=\frac{1}{t_{end}-t_{start}}\int_0^{t_{end}-t_{start}}(P(\tau)-\bar{P}(\tau))^2\,d\tau.$$

8. A method according to claim 7 wherein initiating the output signal where:

$$D^2>M^2\cdot U^2$$

wherein "M" is the predetermined threshold depending upon a predetermined confidence interval setting selected by the user.

* * * * *